United States Patent
Galloway

[11] Patent Number: 5,957,370
[45] Date of Patent: Sep. 28, 1999

[54] PLATING PROCESS FOR FINE PITCH DIE IN WAFER FORM

[75] Inventor: Terry R. Galloway, San Jose, Calif.

[73] Assignee: Integrated Device Technology, Inc., Santa Clara, Calif.

[21] Appl. No.: 08/781,740

[22] Filed: Jan. 10, 1997

[51] Int. Cl.[6] .................................................. B23K 31/02
[52] U.S. Cl. ...................... 228/180.22; 228/246; 228/254
[58] Field of Search ............................ 228/180.22, 246, 228/254

[56] References Cited

U.S. PATENT DOCUMENTS

| | | | |
|---|---|---|---|
| 3,401,126 | 9/1968 | Miller et al. | 252/514 |
| 3,429,040 | 2/1969 | Miller | 29/626 |
| 4,182,781 | 1/1980 | Hooper et al. | 427/90 |
| 4,273,859 | 6/1981 | Mones et al. | 430/315 |
| 4,412,642 | 11/1983 | Fisher, Jr. | 228/173 R |
| 4,664,309 | 5/1987 | Allen et al. | 228/180.2 |
| 4,673,772 | 6/1987 | Satoh et al. | 174/52 FP |
| 4,763,829 | 8/1988 | Sherry | 228/124 |
| 4,783,722 | 11/1988 | Osaki et al. | 361/411 |
| 4,878,611 | 11/1989 | LoVasco et al. | 228/180.2 |
| 4,897,918 | 2/1990 | Osaka et al. | 29/830 |
| 5,208,186 | 5/1993 | Mathew | 437/183 |
| 5,244,833 | 9/1993 | Gansauge et al. | 437/183 |
| 5,251,806 | 10/1993 | Agarwala et al. | 228/180.22 |
| 5,304,460 | 4/1994 | Fulton et al. | 228/180.22 |
| 5,361,491 | 11/1994 | Oomachi et al. | 29/852 |
| 5,388,327 | 2/1995 | Trabucco | 29/830 |
| 5,462,638 | 10/1995 | Datta et al. | 156/656.1 |
| 5,564,617 | 10/1996 | Degani et al. | 228/180.22 |

FOREIGN PATENT DOCUMENTS

| | | |
|---|---|---|
| 0 248 314A2 | 12/1987 | European Pat. Off. . |
| 0 248 566A2 | 12/1987 | European Pat. Off. . |

OTHER PUBLICATIONS

*Metal Finishing 63rd Guidebook and Directory Issue* vol. 93 No. 1A, Jan., 1995 (3 pages).

Primary Examiner—Patrick Ryan
Assistant Examiner—Jeffrey T. Knapp
Attorney, Agent, or Firm—Skjerven, Morrill, MacPherson, Franklin & Friel

[57] ABSTRACT

Apertures in a tape formed on a substrate allow straight plating of solder bumps to heights above 4 mils. The solder bumps are combined with a lower density material to form an hourglass-shaped structure which allows interconnections to bonding pads of electronic components with pitches less than 9 mils.

14 Claims, 4 Drawing Sheets

5,957,370

PLATING PROCESS FOR FINE PITCH DIE IN WAFER FORM

FIELD OF PRESENT INVENTION

The present invention relates to forming interconnections to the bonding pads on an integrated circuit (IC) device. More particularly, the invention is directed to techniques for making solder bumps with a maximum width not appreciably greater than the diameter of the bonding pad which allows finer pitch die in wafer form.

BACKGROUND OF THE INVENTION

The assembly of a semiconductor package requires the packaging of a semiconductor die ("chip") and the interconnection of the electrical contact pads on the die to leads from the package. One such interconnection method is known as C4. "C4" stands for Controlled Collapse Chip Connection. The basic concept of C4 is to connect chips, for example, to leads from chip packages or to traces on multichip module substrates, for example, by means of solder balls partially collapsed between the surfaces of bonding pads on the chips and the leads or traces of the package or multichip module. Tiny balls of electrically conductive solder connect the respective pairs of bonding surfaces (often called "bonding pads" or "pads") on the chip and on the traces. Each pad on the chip has a corresponding pad on the package trace; the pad layouts are mirror images. As the chip is pressed on the traces, the solder balls on the bonding pads of the chip are pressed against the corresponding solderless bonding pads of the traces, partially collapsing the solder balls and establishing electrical connections between the respective bonding pads in one step.

A major application of C4 is in joining semiconductor microchips to chip packages. The C4 balls are placed on chips while they are still joined in a wafer. The chips are made as small as possible to maximize the number of chips that can be obtained per wafer and to increase the chip yield (i.e. the number of good chips obtained divided by the maximum number of chips available from a wafer). For a given defect density, chip yield goes up as chip size goes down. Additionally, the continuous reduction of feature size (submicron feature sizes are now common) by the semiconductor industry requires interconnections at very fine pitches. Therefore, the best C4 fabrication method is the one that allows the placing of thousands of very small, closely-spaced solder balls, each precisely positioned.

C4 solder bumps must be mechanically well-fastened to their bonding pads, or they may be torn off when the two surfaces are pushed together. The attachment of C4 balls requires care.

One method of forming solder balls uses sputtering or vacuum deposition but this method cannot be used for large wafers containing many chips due to limitations on the size of the metal mask used to position the solder bumps. A second method uses electrodeposition to form the solder bumps and also uses a mask to position the solder bumps. However, the electrodeposition method requires a preliminary first step, the creation of a continuous "seed layer" of conductive metal adhered onto the insulating substrate. This metal layer serves to conduct the electrical current which deposits the solder. Alloys such as titanium tungsten (TiW) can be added as barrier layers to prevent intermetallic layers from forming between the solder bump and the bonding pad.

After the seed layer has been laid down, a photoresist mask is formed on the seed layer using a spin on coating technique and the photoresist is then exposed through a mask to light to define the areas where solder bumps are to be formed. Unexposed photoresist where the solder bumps are to be formed is then washed away to leave the cured photoresist behind as a mask.

Following the creation of the photoresist mask with holes where the solder bumps are to be deposited, solder is electrodeposited into the mask holes to form the solder bumps. The photoresist mask is then removed. The seed layer other than under the solder bumps is then removed by etching using a selective etch. Removal of the seed layer electrically isolates the solder bumps. The solder bumps are then reflowed (melted) into solder balls.

In order to provide elongated solder connections between a semiconductor device and a supporting substrate, Lakritz et al. in U.S. Pat. No. 4,545,610 disclose the use of solder extenders. Extensions of solder are formed on a supporting substrate. A semiconductor device having solder mounds corresponding in location to the solder extensions is invertedly placed over the substrate, such that solder extenders and the solder mounds have a direct surface contact. The whole assembly is heated to a temperature sufficient to melt the solder extenders and the solder mounds, thereby forming elongated hourglass shaped solder connections between the device and the substrate.

Allen et al. in U.S. Pat. No. 4,664,309, teach that the life of a solder joint can be increased substantially by a relatively small increase in solder joint height, or by a reduction in solder joint diameter. Allen et al. further disclose that an hourglass-like column-type solder joint provides for more uniform stress and greater flexibility as well as allowing greater packaging density. To this end, Allen et al. describe a mounting device to securely hold preforms of a joint-forming material, such as a solder column, in an aperture.

European Patent Application No. 248,314 discloses the use of a mask, such as a photoresist, to act as a mold for the solder and to thereby produce large solder bump heights.

European Patent Application Publication No. 248,566 discloses heating matching, facing solder bumps on both a package and a substrate so that the contacting solder bumps melt together and coalesce to form an "elongated" solder joint.

Agarwala et al. in U.S. Pat. No. 5,251,806, disclose forming elongated solder interconnections by controlling the collapse of the solder bumps by protecting the solder bumps with encapsulating material. Additional encapsulated solder bumps may be stacked on the first encapsulated layer to provide further elongation of the solder interconnection.

Current conventional processes cannot plate solder bumps at less than a 9 mil pitch for a bump height of 4 mils or more. The processes are limited by the use of the spin-on coating method to apply a photoresist masking material which also acts as a partial mold. The masks produced by spin-on coating are not uniform when the masking material is applied in thicknesses above 2 mils, hence the available mold height using conventional processes is limited to 2 mils. With a mold height limited to 2 mils, solder bumps plated higher than 2 mils are mushroom-shaped and have a poor aspect ratio. The aspect ratio, a convenient parameter used to characterize a solder bump, is defined as the ratio of the volume of the solder bump to the volume of a cylinder having a diameter that is the widest dimension of the solder bump. If the solder bump is a cylinder then this aspect ratio is 1. Typical aspect ratios for prior art solder bumps are significantly less than 1, for example, 0.4 for some mushroom shaped solder bumps. An aspect ratio of 1 for a solder bump indicates that the pitch of a die is limited only by the spacing of the bonding pads since the widest dimension of the solder bump is not appreciably greater than the diameter of the bonding pad.

While the aspect ratio as defined above provides a means for characterizing a solder bump, the aspect ratio is not always a useful characterization. For example, an hourglass shaped solder bump has an aspect ratio of less than 1 but the widest dimension of the solder bump is still not appreciably greater than the diameter of the bonding pad.

SUMMARY OF THE INVENTION

In accordance with this invention, taller solder bumps with maximum widths not appreciably greater than the diameter of the bonding pads are created to allow higher packing densities. Packing densities are effectively limited by the bond pad spacing and not the geometry of the solder bumps.

In accordance with the present invention, solder bumps may be plated higher (for example, 4 to 6 mils high) than in the prior art at pitches less than the prior art pitches (prior art pitches are typically around 9 mils). In one embodiment, transparent adhesive tape of a thickness selected to match the height of the to-be-formed solder bump (for example, 4 to 6 mils thick) is applied to the wafer containing multiple die. The tape has holes cut through it at the bonding pad sites using, for example, a laser guided across the wafer by computer. The difficulties involved with aligning the tape holes with the bonding pad sites are avoided by cutting holes in the tape after the tape has been placed on the wafer. Using the tape as a mold, straight bumps are plated to the desired height. The resulting plated solder bumps possess a substantially cylindrical shape with an aspect ratio approaching 1 as opposed to the mushroom shape produced using the conventional processes.

In accordance with the present invention, a method of forming solder interconnections is provided by combining the selected solder with a lower density material above the barrier metal layer. Porosity is induced in the solder material to create pockets of lower density material within the solder itself. Combining the solder with a lower density material provides for hourglass shaped solder bumps upon reflow and allows for smaller pitches for solder bumps having the same height as those in the prior art.

The ability to achieve smaller pitches than in the prior art allows a higher density of bonding pads which in turn gives more pin outs from the chip. The ability to achieve more pin outs per chip is important, for example, in multimedia chips and microprocessor telecommunication chips.

BRIEF DESCRIPTION OF THE DRAWINGS

FIG. 5b is a top view of the interconnection shown in FIG. 5a; and

DETAILED DESCRIPTION OF THE INVENTION

Current conventional processes cannot plate solder at less than a 9 mil pitch for a 4 mil or higher solder bump because current processes are limited by using spin-on coating techniques to apply the mask material. Applying spin-on coatings with thicknesses greater than 2 mils results in coatings having nonuniform thickness. Currently used processes spin-on coatings 2 mils thick and plate solder bumps 2 mils above the spin-on coating mask for a 4 mil high solder bump. This results in a solder bump having a mushroom shape that is much wider above the spin-on coating than the bond pad (and this mushroom shape has an aspect ratio significantly less than 1) and prevents achieving the smaller separation of solder bumps required for presently used high density chips.

Figure 1A:
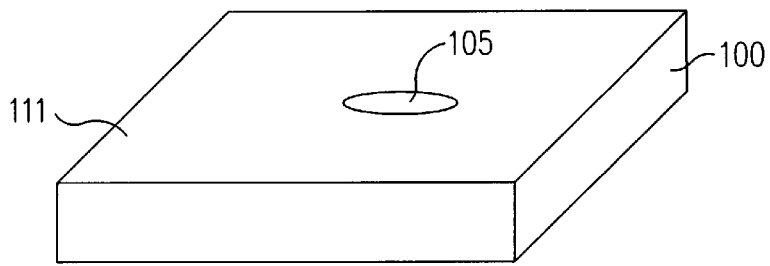
FIGS. 1a–1h show steps in a method of forming solder interconnections on an integrated circuit in accordance with one embodiment of this invention.
Figure 1B:
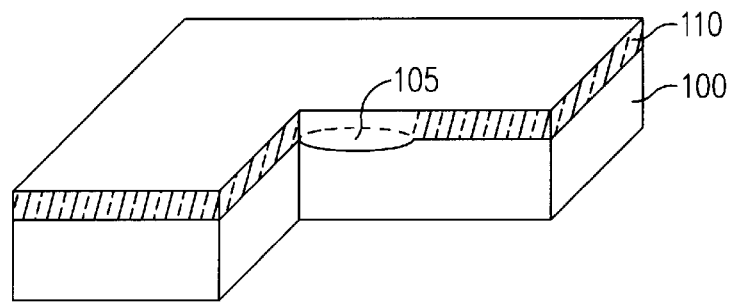
Figure 1C:
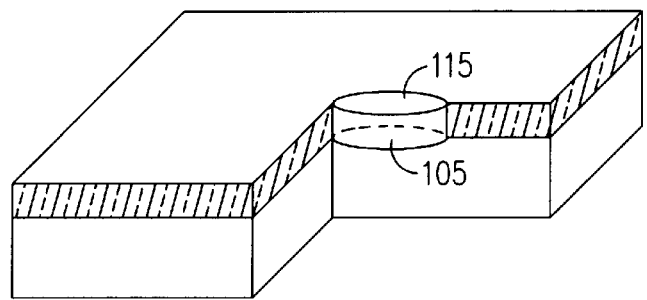
Figure 1D:
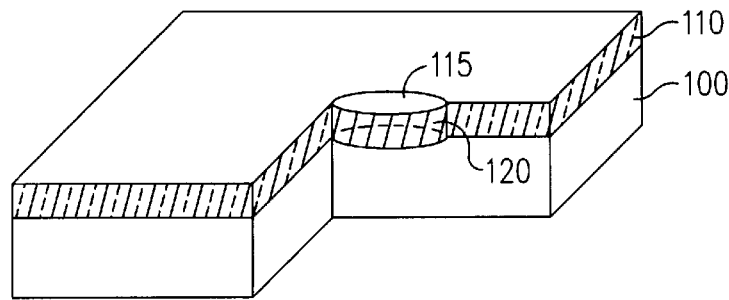
Figure 1E:
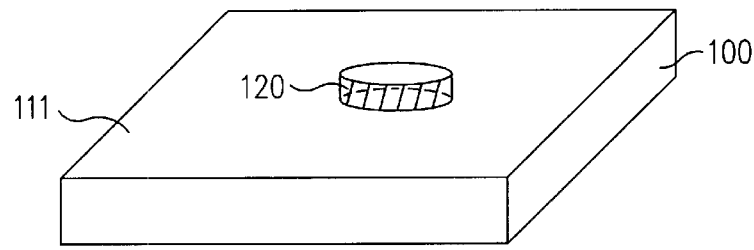
Figure 1F:
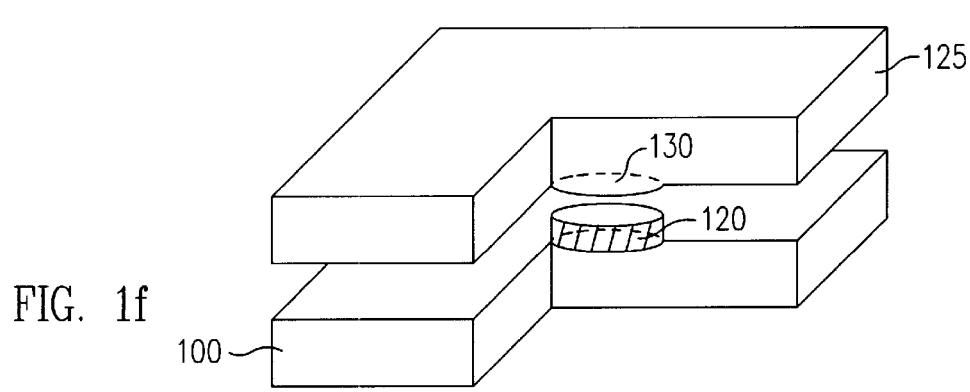
Figure 1G:
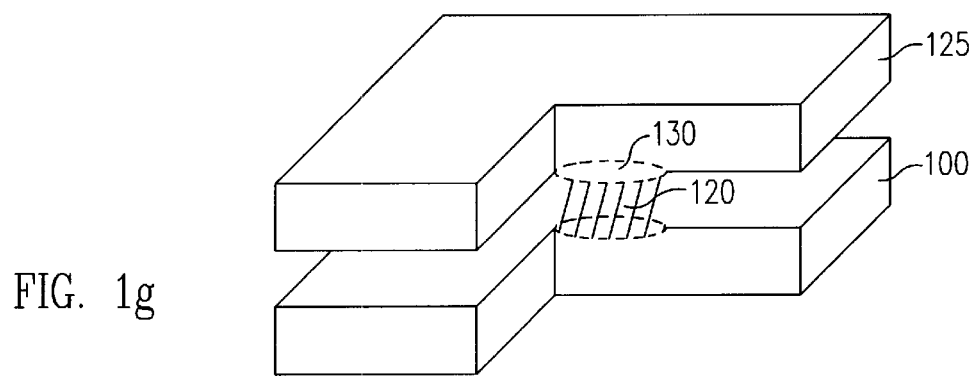
Figure 1H:
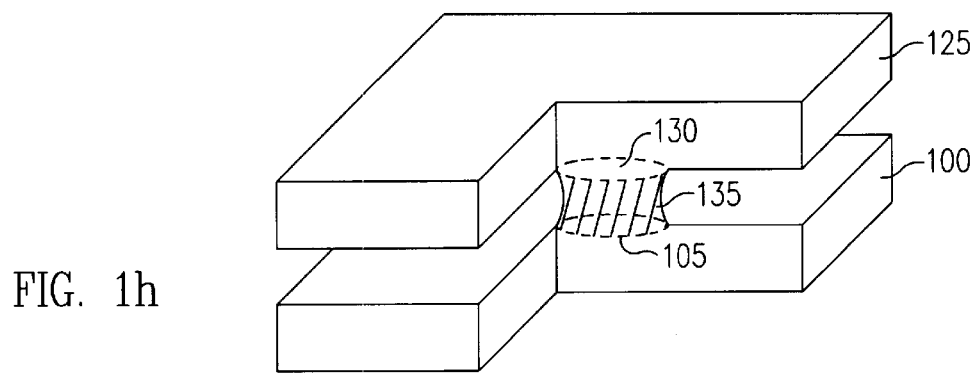

FIGS. 1a–1h show steps in a method of forming solder interconnections on an integrated circuit in accordance with one embodiment of this invention. Specifically, a portion of a die surrounding a bond pad site is shown but it is to be understood that there may be a plurality of bond pad sites in all directions from the portion shown in each of FIGS. 1a–1h. An overview of FIGS. 1a–1h follows:

FIG. 1a shows die 100 with bonding pad 105;

FIG. 1b shows transparent tape 110 applied to die surface 111;

FIG. 1c shows aperture 115 formed in transparent tape 110 extending down to bonding pad 105;

FIG. 1d shows aperture 115 filled with solder bump 120;

FIG. 1e shows die 100 with transparent tape 110 (not shown) removed and solder bump 120;

FIG. 1f shows die 125 with bonding pad 130 aligned with solder bump 120;

FIG. 1g shows bonding pad 130 aligned and in contact with solder bump 120;

FIG. 1h shows solder column 135 formed between bonding pads 105 and 130 after heating solder bump 120.

In accordance with this invention, transparent one sided adhesive tape 110, such as Mitsui tape, that is 4 to 6 mils thick is applied to die 100 that has pre-existing bonding pad sites (see FIGS. 1a and 1b). Transparent tape 110 may be either infrared removable, room temperature removable, or heat removable tape. Transparent tape 110 has apertures 115 cut through it at bonding pad 105 sites using a laser guided across die surface 111 by computer. After physically locating one reference bonding pad on the die, the relative X-Y coordinates of bonding pads 105 are supplied from the CAD system that was used to lay out the chip or the bond pads are located by a teach and learn pattern recognition system that is available commercially (for example, CR Technology, 27752 El Lazo Rd., Suite A, Laguna Niguel). This allows the laser to be automatically moved across die surface 111 to each bonding pad location to form desired apertures 115 in transparent tape 110 and provides for economical manufacturing. Transparent tape 110 is cut by the laser to make aperture 115 down to bonding pad 105 (see FIG. 1c). The laser in one embodiment may be a 50–200 W pulsed $CO_2$ laser operating for a burst duration of 1 $\mu$s–1s, depending on the thickness and type of material to be cut. For example, PVC tape would require a burst duration in the neighborhood of 1 second. The creation of aperture 115 in tape 110 allows straight solder bump 120 of a height greater than the prior art to be plated. Aperture 115 in tape 110 acts as a mold to shape and contain solder bump 120. Solder bump 120 is then plated (see FIG. 1d) and tape 110 removed (see FIG. 1e). Removal of tape 110 may be accomplished either chemically or by mechanically peeling it off die surface 111. In one embodiment, using a 4 mil thick tape, the process allows the plating of 4 mil high solder bumps with a 4 mil pitch or less.

Figure 2:
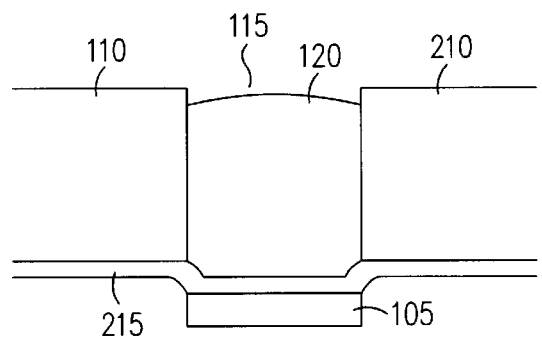
FIG. 2 is a cross-section of an interconnection on a semiconductor device formed in accordance with this invention.

FIG. 2 illustrates solder bump 120 that has been created in aperture 115 in tape 110. Solder bump 120 is deposited above barrier metal 215, typically of TiW. Suitable material for barrier metal layer 215 also includes nickel or any other known barrier material. Barrier metal layer 215 is an optional feature of the invention and serves as an adhesion layer for the solder and to prevent an intermetallic layer from forming between solder bump 120 and bond pad 105. The presence of an intermetallic layer weakens solder adhesion. When the barrier is present, the width of the solder will be approximately 6–7 microns wider than the bond pad width. In one embodiment, the size of bonding pad 105 on die 100 is 100 microns by 100 microns.

Barrier metal layer 215 can be provided at any time before tape 110 is applied to die 100. For example, it is possible to apply barrier metal layer 215 onto bond pads 105 and etch barrier metal layer 215 away at predetermined points prior to application of tape 110. In the event that aluminum oxide has formed on bonding pad 105, the aluminum oxide may be removed by a backetch and then followed by the deposition of a barrier metal such as TiW. In the embodiment shown in FIG. 2, barrier metal layer 215 would be etched at points that align with the vertical edges of aperture 115 to be subsequently created in tape 110.

The present invention is preferably useful with a C4 technology. In C4 technology, solder bumps are placed on bonding pads on the face of a die and the die is bonded face down to pads within the cavity of an integrated circuit package to establish contact over all solder balls. The invention is useful in flip chip technology applications. In accordance with this invention, a die with solder bumps attached to each of its bonding pads may be attached to a lead frame, where the solder is reheated upon pressing the solder bumps of the die onto the lead frame.

In accordance with the present invention, solder bump 120 may be deposited in aperture 115 of tape 110 via electroless plating, electroplating or any other comparable method. Suitable materials for the solder include tin-lead or alloys of nickel, titanium, or tungsten. The amount of solder to be deposited into the aperture depends on the surface tension over time and the desired width of the solder bump.

Figure 4A:
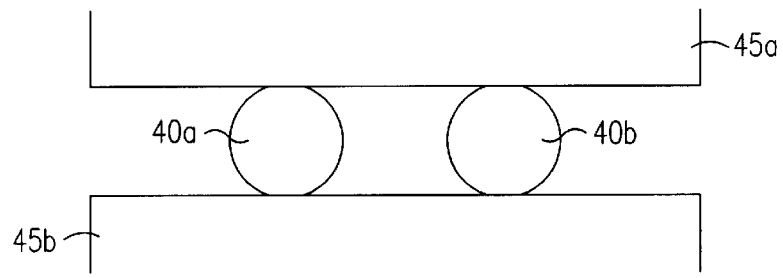
FIG. 4a illustrates the conventional shape of a solder bump fabricated in accordance with prior art.

After forming solder bump 120 and removing tape 110, solder bump 120 is reheated to reflow the solder material while solder bump 120 on die 100 is in contact with bonding pad 130 on die 125 (see FIGS. 1f–1h). The temperature needed to reflow the solder depends on the solder type that is selected. A typical temperature for tin-lead solder reflow is 217° C. FIG. 4a illustrates the general configuration of interconnections formed in C4 technology after the die bumps have been aligned with the pads on component 45b and compressed to form pillars 40a and 40b. Tape, not necessarily of the same type as used for the mold, may be used to act as a spacer between the components to limit compression of the pillars. FIG. 4a shows the resulting structure.

Figure 3:
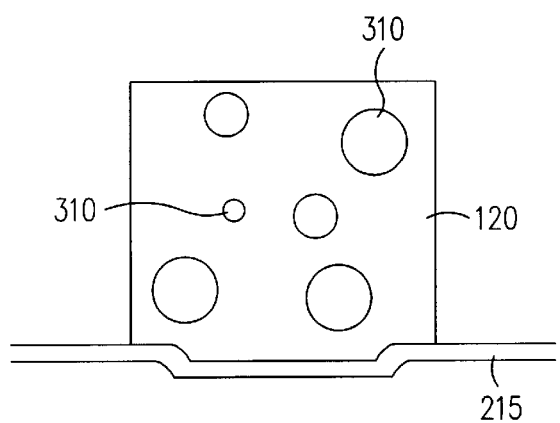
FIG. 3 is a cross-section of an alternative solder bump in accordance with this invention, using a porous material for at least part of the solder bump.
Figure 5A:
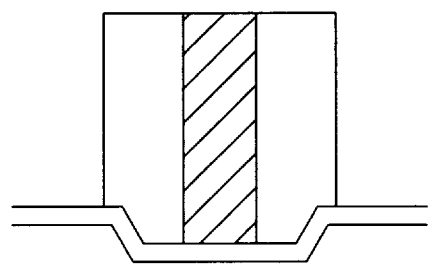
FIG. 5a is a cross-section of an alternative embodiment for manufacturing an interconnection in accordance with the present invention.

A method of forming solder interconnections in accordance with the invention is provided by combining the selected solder with a lower density material and using the holes in the tape to create solder columns. FIG. 3 and FIG. 5a illustrate ways in which such a combination can be provided in accordance with the present invention. In FIG. 3, porosity is induced in the solder material to obtain pockets of lower density material 310 within the solder itself. Introduction of porosity into the solder material reduces the volume of solder present. In one embodiment, porosity is introduced into solder bump 120 during solder bath plating by plating at a current density of between 35–40 amperes/square foot. The ranges of the values for the composition and operating conditions of the solder bath are given in table 1. Except for the current density, the values presented in table 1 are from "Metal Finishing: Guidebook and Directory Issue", New York, Elsevier, 1995, vol. 93, no. 1A, p. 300. Plating in this range of current densities results in 'flaky' layers of solder being deposited in forming the solder bumps. The 'flaky' structure allows formation of solderless (porous) regions inside the solder bumps. Current densities in excess of 40 amperes/square foot result in blackening of the solder material which is undesirable. Liquid from the solder bath may be trapped in the porous regions of the solder but can be removed by subsequent baking.

TABLE 1

| Composition and Operating Conditions foe Solder Bath | Value(s) |
| --- | --- |
| Stannous tin | 7–8 ounces/gal. |
| Lead | 3–4 ounces/gal. |
| Fluorobic acid | 13–20 ounces/gal. |
| Boric acid | 3–5 ounces/gal. |
| Liquid peptone | 2–3 ounces/gal. |
| Current density | 35–40 amperes/square foot |
| Anode to cathode ratio | 2:1 optimum |
| Anodes | 60/40 tin lead bagged with polypropylene |
| Temperature | 60–80° F. |
| Agitation | mild cathode rod |
| Filtration | Continuous is recommended to maintain a clear solution |

In another embodiment, the lower density material may be provided, for example, in the form of an inner-cylinder surrounded by an annular cylinder of solder with a break in it. This embodiment, illustrated in top view in FIG. 5b, uses a laser to cut a substantially C shaped pattern into the tape to serve as an aperture and mold for the solder. The purpose of combining the solder with a lower density material is to produce a concave solder column, resembling an hourglass, upon reflow (see FIG. 1h). On reflow, the surface tension acts to distribute the available solder over the bonding pads of the two components, drawing solder from the middle of the solder columns. The solder displaces the inner-cylinder of lower density material. This process results in an hourglass shape for the resulting solder connections. The concave, hourglass shape permits closer spacing of solder bumps because the solder bumps are not in danger of coming into contact in the equatorial region. In contrast, if the same height solder bumps are desired under the prior art, the equatorial bulge present on reflow in prior art solder bumps prevents achieving the smaller pitches possible in accordance with this invention. Hence, the pitch in prior art is limited by the equatorial bulge of the solder bumps and not the spacing of the bond pads (i.e. see FIGS. 4a and 4b).

The volume ratio of lower density material to solder equals the volume percentage of porosity induced in the overall solder material. Factors influencing the appropriate volumes for the solder and the lower density material include surface tension, the desired height for the solder columns, and the size of the bond pad on the top and bottom surfaces. The desired hourglass shape is controlled by the lack of material and the surface tension onto the bonding pads. Decreasing the volume of the available solder material allows formation of the hourglass solder column on reflow.

Figure 4B:
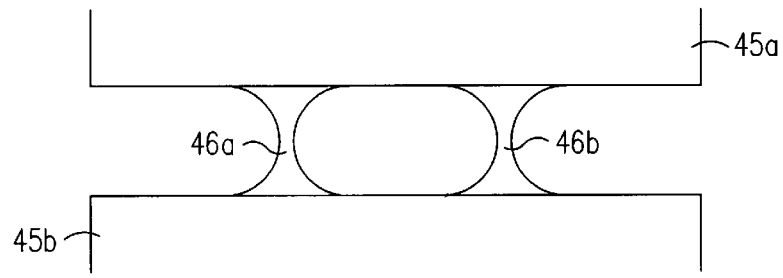
FIG. 4b illustrates the shape of an interconnection using solder bumps fabricated in accordance with the present invention.
Figure 5B:
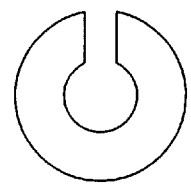
Figure 5C:
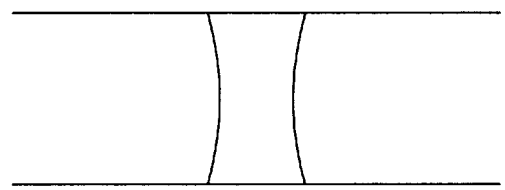
FIG. 5c is a lateral view of an interconnection formed using the structure shown in FIG. 5a and FIG. 5b in accordance with this invention.

Solder columns 46a and 46b in one embodiment are obtained by using a combination of solder and lower density material as shown in FIG. 4b. Solder columns 46a and 46b in FIG. 4b have a concave appearance, and thus are less susceptible to a "balling effect". In addition, the pillars resulting after the joining of two components 45a and 45b together are significantly narrower than solder columns 40a and 40b in the standard configuration shown in FIG. 4a because less solder was used in creating solder columns 46a and 46b. The overall intention is to induce sufficient porosity so that upon compression of the pillars by the pad areas of the two components, all the bumps establish good contact between the two components. On the other hand, care must be taken to balance the volume ratios of solder to lower density material so that a severe weak point is not created in the center of the concave pillar. The porous material within the solder (i.e., the material of lower density) could be a gas or mixture of gases, such as air, or the porous material could be something that is dissolvable or any other material that is easily removable prior to or as a result of compression.

The embodiments described herein are merely illustrative of the invention. Accordingly, various modifications may be made to the above-described embodiments without departing from the spirit and scope of the invention.

I claim:

1. A method for making solder interconnections on an integrated circuit comprising the following steps:
    a) providing a die surface with a first bonding pad;
    b) applying a layer of tape on said die surface;
    c) forming an aperture in said layer of tape, said aperture extending through said layer of tape to said first bonding pad;
    d) filling said aperture with a solder bump;
    e) removing said layer of tape;
    f) providing a surface with a second bonding pad and aligning said second bonding pad with said solder bump on said first bonding pad such that said second bonding pad faces said first bonding pad;
    g) moving said surface proximate to said die surface such that said second bonding pad contacts said solder bump; and
    h) heating said solder bump to form a solder column electrically coupling said first bonding pad to said second bonding pad.

2. The method of claim 1, wherein said aperture is filled with said solder bump by solder bath plating.

3. The method of claim 2 wherein said solder bath plating is performed at current densities between 30 amperes/square foot and 45 amperes/square foot.

4. The method of claim 1, wherein said solder bump is combined with a lower density material above said die surface.

5. The method of claim 1, wherein said aperture is formed by a laser.

6. The method of claim 5, wherein said laser is positioned by a computer.

7. The method of claim 6, wherein said computer uses a teach and learn pattern recognition system to position said laser over said bonding pad.

8. The method of claim 6, wherein said computer uses a predetermined set of X-Y coordinates from a computer aided design system to position said laser over said bonding pad.

9. The method of claim 4, wherein said lower density material includes a gas or a combination of gases formed within said material to create porous regions within said material.

10. The method of claim 4, wherein a plurality of regions of said low density material are contained within said solder bump.

11. The method of claim 10, wherein said lower density material is a gas.

12. The method of claim 4, wherein said solder bump is provided as a C shaped annular cylinder, said C shaped annular cylinder surrounding an inner-cylinder of said lower density material.

13. The method of claim 12, wherein said lower density material includes a gas or a combination of gases formed within said material to create porous regions within said material.

14. The method of claim 10, wherein said lower density material includes a gas or a combination of gases.

* * * * *